United States Patent
Lee

(10) Patent No.: US 7,125,496 B2
(45) Date of Patent: Oct. 24, 2006

(54) ETCHING METHOD USING PHOTORESIST ETCH BARRIER

(75) Inventor: Sung-Kwon Lee, Kyoungki-do (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/166,421

(22) Filed: Jun. 10, 2002

(65) Prior Publication Data

US 2003/0000920 A1    Jan. 2, 2003

(30) Foreign Application Priority Data

Jun. 28, 2001   (KR) ............... 2001-37409
Jun. 28, 2001   (KR) ............... 2001-37411
Jun. 28, 2001   (KR) ............... 2001-37495

(51) Int. Cl.
*H01L 21/00*    (2006.01)
*B44C 1/22*    (2006.01)

(52) U.S. Cl. ............. 216/41; 216/62; 216/79; 438/695; 438/708; 438/723; 438/725

(58) Field of Classification Search ............ 216/40, 216/41, 62, 79; 730/5; 438/708, 723, 725
See application file for complete search history.

(56) References Cited

U.S. PATENT DOCUMENTS

| | | | | |
|---|---|---|---|---|
| 4,859,573 A | * | 8/1989 | Maheras et al. | 430/326 |
| 5,126,289 A | * | 6/1992 | Ziger | 438/671 |
| 5,549,784 A | * | 8/1996 | Carmody et al. | 438/700 |
| 5,648,198 A | * | 7/1997 | Shibata | 430/296 |
| 5,660,957 A | * | 8/1997 | Chou et al. | 430/5 |
| 6,069,087 A | * | 5/2000 | Keller et al. | 438/706 |

(Continued)

FOREIGN PATENT DOCUMENTS

KR    2000-0001567 A    1/2000

(Continued)

OTHER PUBLICATIONS

Official action in foreign counterpart application dated Apr. 21, 2003, and ROC Patent Publication No. 334623.

(Continued)

*Primary Examiner*—Shamim Ahmed
(74) *Attorney, Agent, or Firm*—Marshall, Gerstein & Borun LLP

(57) ABSTRACT

A method of etching is disclosed using a photoresist etch barrier formed by an exposure with a light source of which wavelength is in the range of 157 nm to 193 nm, such as an argon fluoride(ArF) laser or fluorine laser($F_2$ laser), the method includes the steps of coating a photoresist layer on a etch target layer; forming photoresist pattern by developing the photoresist layer after exposing the photoresist layer with a light source of which wavelength is in the range of 157 nm to 193 nm; forming a polymer layer and etching a portion of the etch target layer simultaneously with a mixture of fluorine-based gas, an Ar gas and an $O_2$ gas, wherein the fluorine-based gas is $C_xF_y$ or $C_aH_bF_c$, and wherein x, y, a, b and c range from 1 to 10, respectively; and etching the etch target layer using the polymer layer and the photoresist pattern as the etch mask.

19 Claims, 12 Drawing Sheets

U.S. PATENT DOCUMENTS

| | | | |
|---|---|---|---|
| 6,074,569 A * | 6/2000 | Kiziloglu et al. | 216/62 |
| 6,087,063 A * | 7/2000 | Hada et al. | 430/270.1 |
| 6,458,671 B1 * | 10/2002 | Liu et al. | 438/391 |
| 6,551,446 B1 * | 4/2003 | Hanawa et al. | 156/345.48 |
| 6,583,065 B1 * | 6/2003 | Williams et al. | 438/714 |
| 6,635,185 B1 * | 10/2003 | Demmin et al. | 216/64 |
| 6,933,236 B1 * | 8/2005 | Lee et al. | 438/695 |

FOREIGN PATENT DOCUMENTS

| | | |
|---|---|---|
| KR | 2001-0003218 A | 1/2001 |
| KR | 2001-0047179 A | 6/2001 |

OTHER PUBLICATIONS

Notice of Preliminary Rejection from Korean Intellectual Property Office (RE: Korean Priority Application No. 2001-37409) dated Mar. 21, 2005.

Notice of Preliminary Rejection from Korean Intellectual Property Office (Re: Korean Priority Application No. 2001-37411) dated Mar. 21, 2005.

* cited by examiner

ETCHING METHOD USING PHOTORESIST ETCH BARRIER

TECHNICAL FIELD

Methods for manufacturing semiconductor devices are disclosed, which include an etching method using a photoresist etch barrier formed by an exposure with a light source of which wavelength is in the range of 157 nm to 193 nm, such as an argon fluoride(ArF) laser or fluorine laser($F_2$ laser).

DESCRIPTION OF THE RELATED ART

In semiconductor memory device fabrication processes, photolithography is used to form patterns on a substrate with various materials. A photoresist, polymer is coated on a target layer, and exposed selectively with a mask to induce photoreaction in the photoresist. Then, the photoresist is developed to form an etch barrier for etching the target layer, and a predetermined patterns are obtained by etching the target layer.

The integration of the semiconductor memory device has been improved using lithography technology. Generally, lithography processes are carried out with an exposing process and a developing process. Recently, lithography processes usually represent an exposing process and lithography technology is classified into optical lithography or non-optical lithography.

The development of photolithography has been accomplished by the development in the every filed of an exposure equipment, a photoresist material, a mask and a process. In the field of exposure systems, a high numerical aperture lens of over 0.6 mm and hardware, that provide alignment, has been developed. With respect to the development of the photoresist material, a chemically amplified can be a representative. The developments of a phase shift mask and an optical proximity correction are good representatives in the field of the mask. Also, tri-linear resist (TLR), bi-linear resist (BLR), top surface imaging (TSI) and anti reflective coating (ARC) processes have been developed.

The initial exposure equipment is a contact printer, where a mask is directly contacted with a substrate and aligned by an operator who looks directly at the mask and the substrate with the naked eye. As the gap between the substrate and the mask is decreased, resolution can be improved and the substrate is exposed with an approach printer, such as soft contact or hard contact (below 10 μm) depending on the gap.

In the early 1970s, when exposure equipment of a projection-type that applies an optical device using reflection or refraction of light was developed, resolution was improved and the lifetime of a mask was extended. As a result, the exposure equipment of the projection-type was used in the product development of large substrates.

In the mid-1970s, use of a stepper projection optical device began, which started the development of lithography technology which contributed to mass-production of semiconductors. The stepper is an abbreviated form of "step and repeat". The exposure equipment using the stepper was implemented to improve the resolution and alignment accuracy. In the initial stepper, a reduced projection exposing method, which a ratio of the mask pattern to the substrate was 5:1 or 10:1, was designed. However, the reduced projection exposing method of 5:1 was generally employed due to limitations of the mask pattern.

A scanner of a "step and scanning" type was developed in the early 1990s, which reduced the ratio to 4:1. However, such a scanner performed poorly in terms of the mask pattern even though the scanner was used to increase production efficiency and was applied more regularly as chip sizes decreased.

The resolution is largely related with wavelength of the light source. The wavelength of the stepper employing the step and repeat type had been changed 436 nm(g-line), 365 nm(i-line), 248 nm a KrF laser(Deep Ultra-Violet, DUV), in this order. An initial exposure equipment using g-line (wavelength ($\lambda$)=436 nm) could implement a pattern of a 0.5 μm level and an exposure equipment using i-line ($\lambda$=365 nm) could implement a pattern of a 0.3 μm level. In the DUV photolithography using light, of which wavelength is 248 nm, a pattern of a 0.8 μm level could be implemented because of the problems of a time delay effect and a base dependency. Accordingly, it is needed to develop a new DUV photolithography employing an ArF laser of which wavelength is 193 nm in order to form a pattern of below 0.15 μm.

The DUV lithography technology has excellent resolution for the i-line and DOF, however, such technology is difficult to control. This problem can arise optically due to a short wavelength and/or chemically due to use of a chemical amplified resister. As the wavelength becomes shorter, critical dimension (CD) is varied due to a standing wave and overdeveloping is generated by reflection light due to a difference of base phases. The CD variation of a line width is periodically changed by interference of incident light and reflective light and is also changed by a minute variation of a thickness of a photoresist or a base film. A chemical amplified resist has to be employed for improving sensitivity in the DUV process. However, there are problems of PED (post exposure delay) stability, base dependency and the like with respect to the reaction mechanism.

Now, an exposure equipment using an ArF laser ($\lambda$=193 nm) is developed to form a pattern of 0.11 μm. A main issue with ArF exposure technology is the development of a photoresist for ArF. Basically, the photoresist used for KrF has to be improved to be used for ArF. However, the photoresist for KrF, such as a polymer type of a COMA (cycloolefin-maleic anhydride) family, an acrylate family or a mixture type, having a benzene ring structure cannot be used in case of employing the ArF laser. The photoresist with the benzene ring structure has been used in case of employing the KrF laser for the i-line to secure tolerance for dry etching. When the photoresist with the benzene ring structure is used in case of employing the ArF laser, since the absorbency of light is increased in a wavelength of 193 nm, which is a wavelength of the ArF laser, the permeability of light is reduced so that it is impossible to expose the lower side of the photoresist. In addition, when the ArF lithography technology is employed using the photoresist, in which the benzene rings are contained, the deformation of photoresist pattern is caused. Also, the photoresist pattern can be clustered on one side in the etching process.

For example, in the etching process, photoresist pattern of a striation type, formed by exposure with ArF laser, is deformed. The deformation of the photoresist pattern formed by exposure with ArF laser, is also generated in the etching process for forming a contact hole. Therefore, it is impossible to obtain a contact hole of which the critical dimension is 0.1 μm or less with the photoresist pattern because of the photography limitation.

Accordingly, a photoresist, which does not have benzene rings, secures tolerance for dry etching, has good adhesiveness and can be developed with 2.23% TMAH, has been developed.

FIGS. 1A to 1D are diagrams showing a process for forming a bit line contact hole with the ArF lithography technology according to the prior art.

FIG. 1A shows a layout of an active layer 11, word lines 12, a bit line 13 and a bit line contact plug between the active layer 11 and the bit line.

FIG. 1B is a cross sectional view according the line X-X' of FIG. 1A, it shows the bit line 13 formed according to the prior art. In FIG. 1B, the reference numeral '10' denotes a substrate and '15' and '16' denotes interlayer insulating layer. As shown in FIG. 1B, the bit line contact plug 14 is exposed after forming the bit line 13 because of the limitation of the critical dimension.

In addition, as shown in FIG. 1C, undercuts 18 may be formed by the damage caused during the etching process for forming bit line 13. Also, the exposed bit line contact plug 14 is damaged during the etch process for forming the bit line 13. Therefore, a trench T is formed in the contact plug 14, the trench T is filled with an insulation layer 19 and thus a void V is formed in the interlayer insulating layer 19. The bit line 13 can be shorted with other conduction lines owing to the void V, and a contact resistance can be increased owing to the insulating layer 19 filled in the trench.

As mentioned above, it is not easy to reduce the critical dimension of the contact hole, therefore a method of flowing the photoresist pattern is performed at a high temperature to define a contact region having a reduced critical dimension, however the method causes another burden of thinning the photoresist pattern which covers neighboring regions of the contact hole. Accordingly, the critical dimension of the contact hole is limited to 90 nm even if the method of flowing the photoresist pattern is used.

SUMMARY OF THE DISCLOSURE

To avoid the above-noted problems, an etching method is disclosed that is capable of preventing the deformation of photoresist pattern formed by exposure with a light source of which wavelength is in the range of 157 nm to 193 nm, such as an argon fluoride(ArF) laser or fluorine laser($F_2$ laser).

A disclosed etching method using a photoresist pattern as an etch mask, comprises: coating a photoresist layer on a etch target layer; forming photoresist pattern by developing the photoresist layer after exposing the photoresist layer with a light source of which wavelength is in the range of 157 nm to 193 nm; forming a polymer layer and etching a portion of the etch target layer simultaneously with a mixture of fluorine-based gas, an Ar gas and an $O_2$ gas, wherein the fluorine-based gas is $C_xF_y$ or $C_aH_bF_c$, and wherein x, y, a, b and c range from 1 to 10, respectively; and etching the etch target layer using the polymer layer and the photoresist pattern as the etch mask.

The disclosed method further may comprise a step of hardening the photoresist pattern after or before the step of forming the polymer layer.

The method further may comprise a step of flowing the photoresis pattern before the step of forming the polymer layer.

BRIEF DESCRIPTION OF THE DRAWINGS

The above and other features of the disclosed etching techniques will become apparent from the following description of the presently preferred embodiments given in conjunction with the accompanying drawings, wherein.

DETAILED DESCRIPTION OF THE PRESENTLY PREFERRED EMBODIMENTS

Hereinafter, an etching method capable of preventing the deformation of photoresist pattern formed by exposure with a light source of which wavelength is in the range of 157 nm to 193 nm, such as an ArF laser or $F_2$ laser, according to the disclosure will be described in detail referring to the accompanying drawings.

FIGS. 2A to 2D are cross-sectional views illustrating a process for forming contact hole according to a first disclosed embodiment.

Figure 1A:
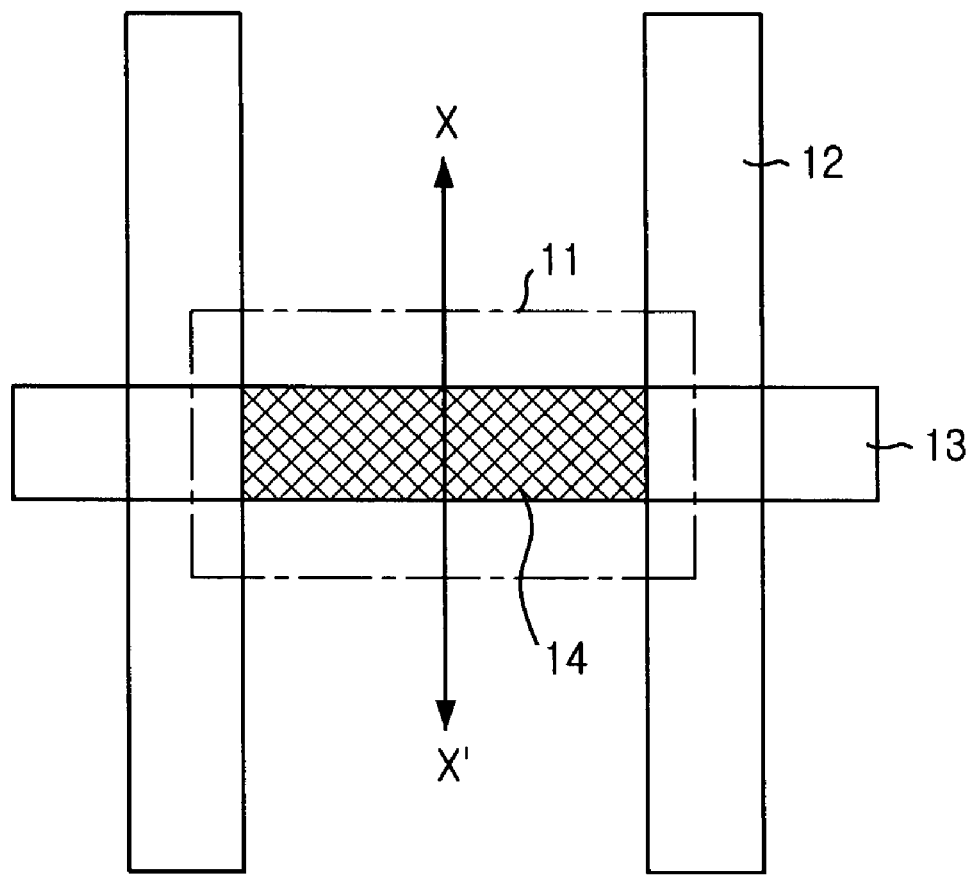
FIGS. 1A to 1D are diagrams illustrating a conventional process for forming contact hole by using an ArF lithography technology.
Figure 1B:
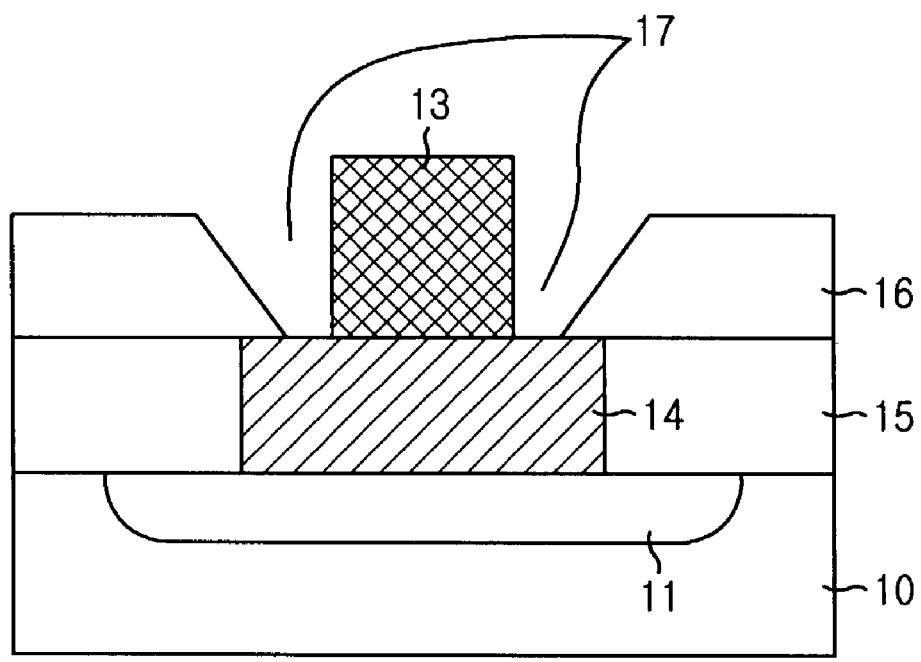
Figure 1C:
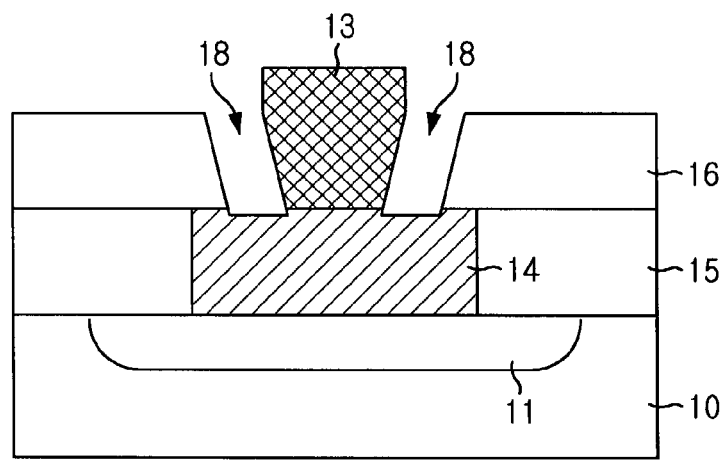
Figure 1D:
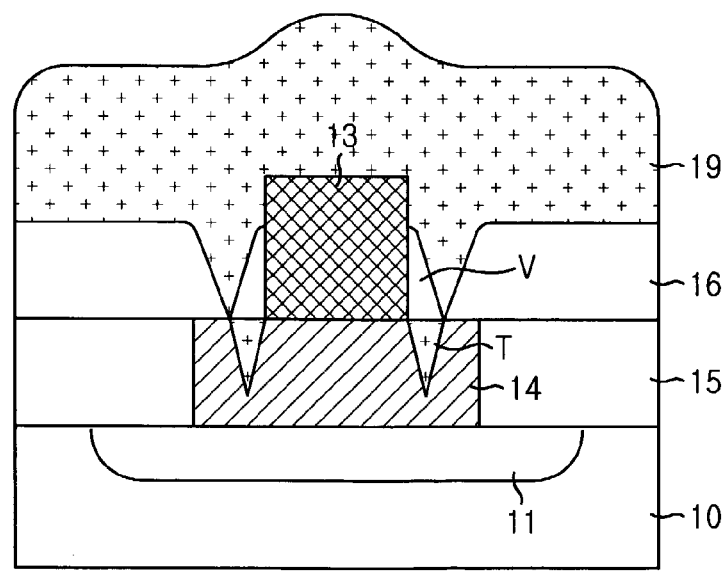
Figure 2A:
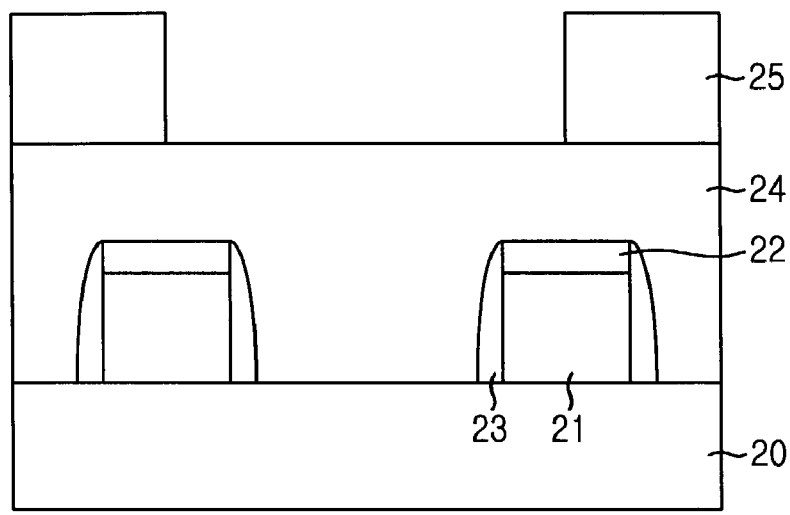
FIGS. 2A to 2D are cross-sectional views illustrating a process for forming contact by using an ArF lithography technology according to a first disclosed.

Referring to FIG. 2A, gate electrodes 21 as an example of adjacent conductive patterns, are formed on a semiconductor substrate 20, a hard mask 22 and spacers 23 are formed on top surface and the sidewalls of electrode, respectively, and then an interlayer insulating layer 24 is formed over the semiconductor substrate 20. The hard mask 24 prevents the gate electrode from being damaged during a subsequent self-align contact etch process. In a preferred embodiment, the hard mask and the spacers are formed of nitride layer, and the interlayer insulating layer is formed of an oxide of advanced planarization layer, a boro phospho silicate (BPSG), a spin on glass(SOG), a high density plasma oxide or a nitride layer.

Thereafter, a photoresist is coated on the interlayer insulating layer 24, and photoresist patterns 25 are formed by exposure with a light source of which wavelength is in the range of 157 nm to 193 nm, such as an ArF laser or $F_2$ laser. In a preferred embodiment of the present invention, the photoresist patterns 25 are formed by coating resist of a COMA (cycloolefin-maleic anhydride) family or an acrylate family to a thickness ranging from about 500 Å to about 6000 Å.

Figure 2B:
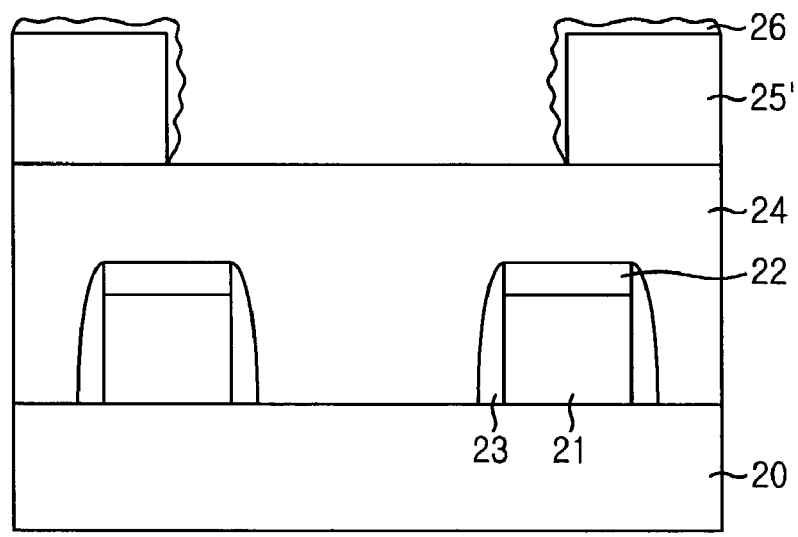

Referring to FIG. 2B, a polymer layer 26 is formed on the photoresist pattern using plasma produced by mixture gas of fluorine and oxygen, and then hardened photoresist patterns 25' are formed by using Ar.

The polymer layer 26 is formed by oxygen and fluorine plasma produced by fluorine-based gas such as $C_xF_y$ or $C_aH_bF_c$, wherein x, y, a, b and c range from 1 to 10, respectively, a $F_2$ gas and $O_2$ gas, at a temperature ranging from about 25° C. to about 80° C. At this time the $O_2$ gas is supplied with a rate from about 1 sccm to about 5 sccm.

The hardened photoresist patterns 25' are formed by an Ar plasma treatment or an Ar ion implantation in order to improve the etch tolerance. The Ar plasma treatment is performed at a low pressure ranging from about 1 mTorr to about 10 mTorr and a high power ranging from about 500 W to about 2000 W. The Ar ion implantation is performed by implanting Ar ions with a dose ranging from about $10^{10}/cm^3$ to about $10^{15}/cm^3$ with an energy ranging from 100 KeV to 300 KeV. Therefore, it is possible to prevent the photoresist patterns from being deformed by forming the hardened photoresist patterns at the low pressure and the high power condition.

Figure 2C:
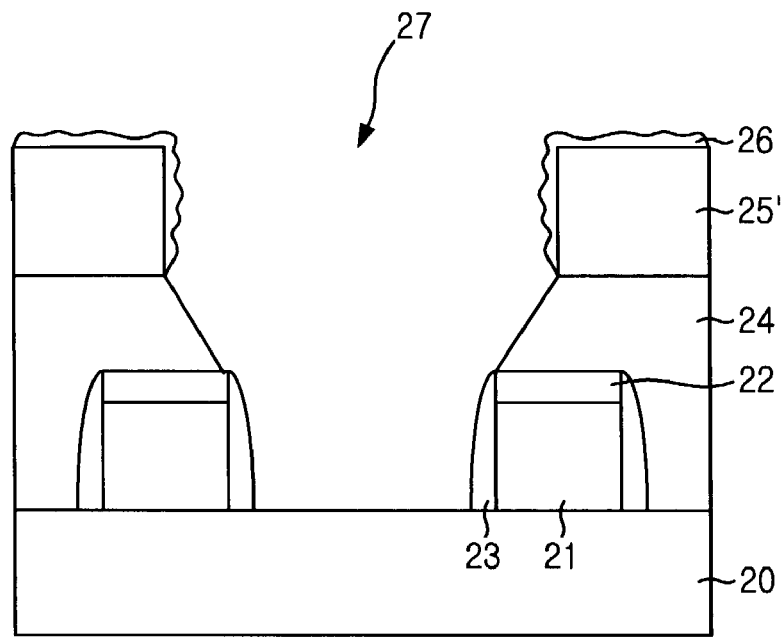

Referring to FIG. 2C, the interlayer insulating layer 24 is etched to form a contact hole 27 exposing the spacer 23 and the surface of the semiconductor substrate 20 between the adjacent gate electrodes 21 by using the polymer layer 26 and the hardened photoresist patterns 25' as an etch mask. In the etching process for forming the contact hole 27, the semiconductor substrate 10 is maintained to a constant temperature, and plasma produced by a fluorine-based gas, such as $C_xF_y$ or $C_aH_bF_c$, wherein x, y, a, b and c range from 1 to 10, respectively and an Ar gas. After the etch process, a cleaning process is performed to remove byproducts such as polymer.

Figure 2D:
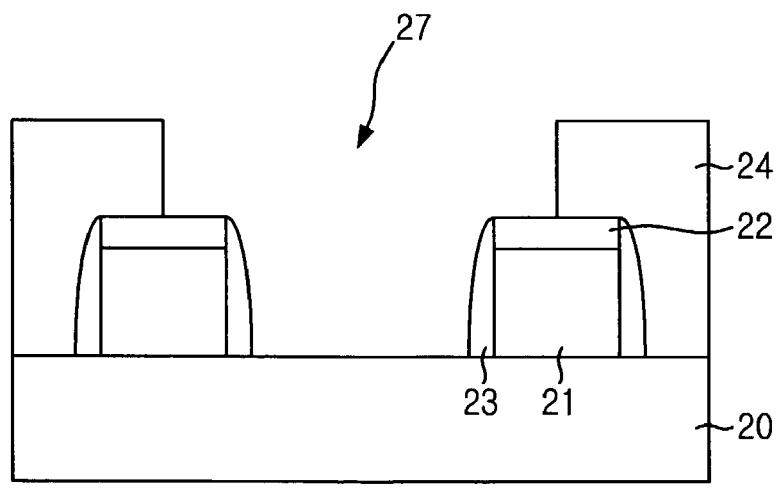

Referring to FIG. 2D, the polymer layer 26 and the hardened photoresist patterns 25' are removed.

By the first disclosed embodiment, it is possible to prevent the photoresist patterns, formed by the exposure with a light source of which wavelength is in the range of 157 nm to 193 nm, from being deformed by hardening the photoresist patterns on which polymer layer is formed.

FIGS. 3A to 3E are cross-sectional views illustrating a process for forming a bit line by using an ArF lithography technology according to a second disclosed embodiment.

Figure 3A:
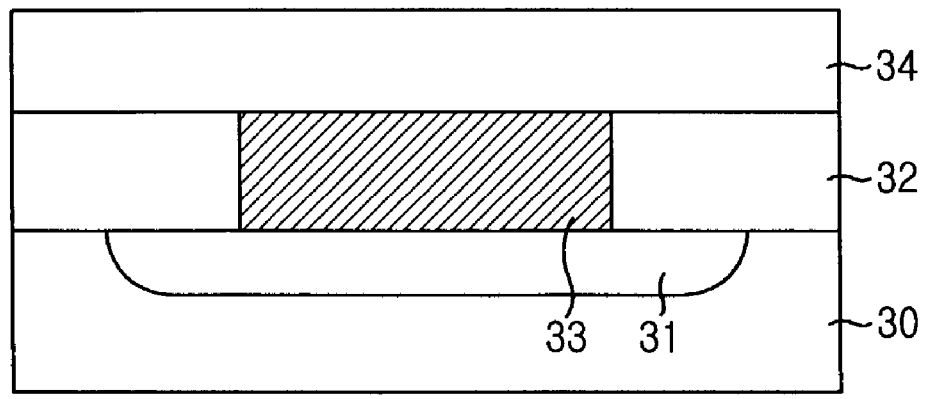
FIGS. 3A to 3E are cross-sectional views illustrating a process for forming contact by using an ArF lithography technology according to a second disclosed embodiment.

Referring to FIG. 3A, an interlayer insulating layer 32 is formed on a semiconductor substrate 30 in which an active layer 31, such as a source or drain, is formed. Thereafter, the interlayer insulating layer 32 is selectively etched to form a contact hole exposing the active layer 31, and then, a conducting layer is formed over the semiconductor substrate 30. A process for flattening the conducting layer is performed until the surface of the interlayer insulating layer 32 is exposed, whereby a bit line contact plug 33, which is contacted to the active layer 31 through the contact hole, is obtained. Thereafter, an interlayer insulating layer 34 is formed on the interlayer insulting layer 32 and the bit line contact plug 33. In the preferred embodiment of the present invention, the conducting layer is formed of a single crystalline silicon layer grown by the selective epitaxial growth or a poly crystalline silicon layer, and the interlayer insulating layer 34 is formed of an oxide of advanced planarization layer, a boro phospho silicate(BPSG), a spin on glass (SOG), a high density plasma oxide or a nitride layer.

Figure 3B:
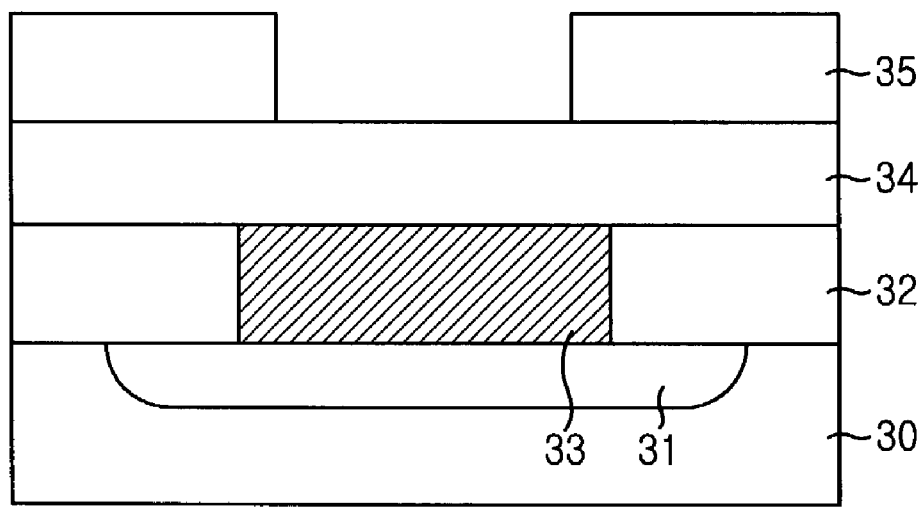

Referring to FIG. 3B, photoresist patterns 35 are formed by exposure with a light source of which wavelength is in the range of 157 nm to 193 nm, such as an ArF laser or $F_2$ laser, on the interlayer insulating layer 34, and the photoresist patterns 35 are hardened to improve etch tolerance. In a preferred embodiment of the present invention, the photoresist patterns 35 are formed a resist of a COMA (cycloolefin-maleic anhydride) family or an acrylate family. The photoresist patterns 35 are hardened by an Ar ion implantation or an electron beam injection. In case of an electron beam injection, the photoresist patterns can be shrunk, and therefore, it is needed to inject the electron beam with adequate energy. In the preferred embodiment, the electron beam is injected with energy ranging from about 400 μC/cm³ to about 4000 μC/cm³.

Figure 3C:
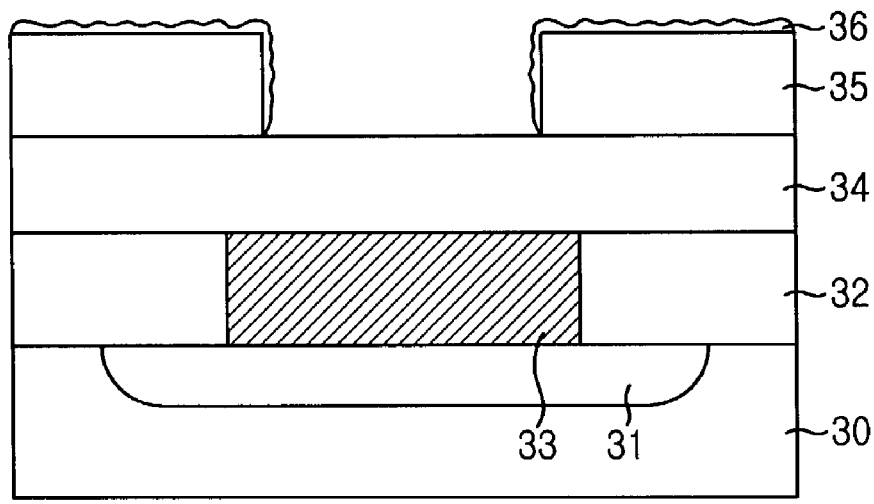

Referring to FIG. 3C, a polymer layer 36 is formed to a thickness ranging from about 50 Å to about 500 Å, at this time, a portion of the interlayer insulating layer 34 is etched simultaneously. The polymer layer is formed by supplying approximately 5 sccm to 20 sccm of a fluorine-based gas, approximately 100 sccm to 1000 sccm of an Ar gas, and approximately 1 sccm to 5 sccm of an $O_2$ gas at pressure ranging from about 10 mTorr to about 50 mTorr with a power ranging from about 500 W to about 2000 W for approximately 10 seconds to 60 seconds. The fluorine-based gas is $C_xF_y$ or $C_aH_bF_c$, wherein x, y, a, b and c range from 1 to 10, respectively. It is possible to reduce the critical dimension of a contact hole by the thickness of the polymer layer 36.

Figure 3D:
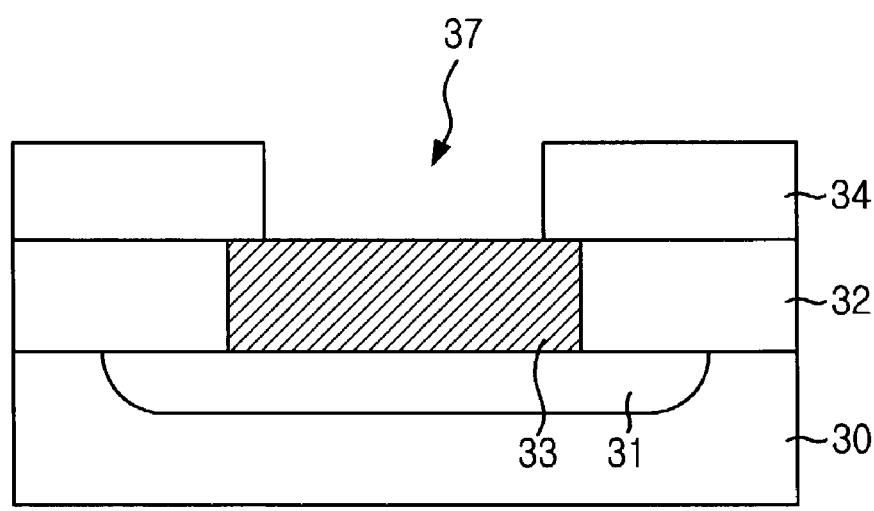

Referring to FIG. 3D, the interlayer insulating layer 34 is etched to form a contact hole 37 exposing the bit line contact plug 22 by using the hardened photoresist patterns 35 covered with the polymer layer 36 as an etch mask. Thereafter, the photoresist patterns 35 and the polymer layer 36 are removed.

Figure 3E:
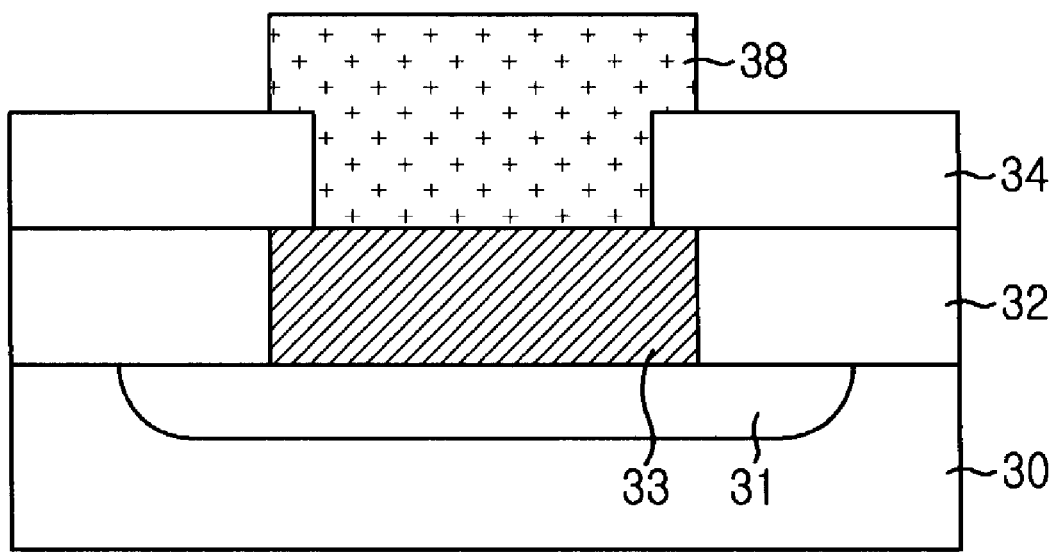

Referring to FIG. 3E, a bit line 38, contacted to the bit line contact plug through the contact hole 37, is formed. In the preferred embodiment of the present invention, the bit line 38 is formed of W, Ti or Co.

By the second disclosed embodiment, it is possible to form fine patterns and to improve reliability by forming the polymer layer on the photoresist patterns, formed by the exposure with a light source of which wavelength is in the range of 157 nm to 193 nm, after hardening the photoresist patterns.

FIGS. 4A to 4F are cross-sectional views illustrating a process for forming a bit line by using an ArF lithography technology according to a third disclosed embodiment.

Figure 4A:
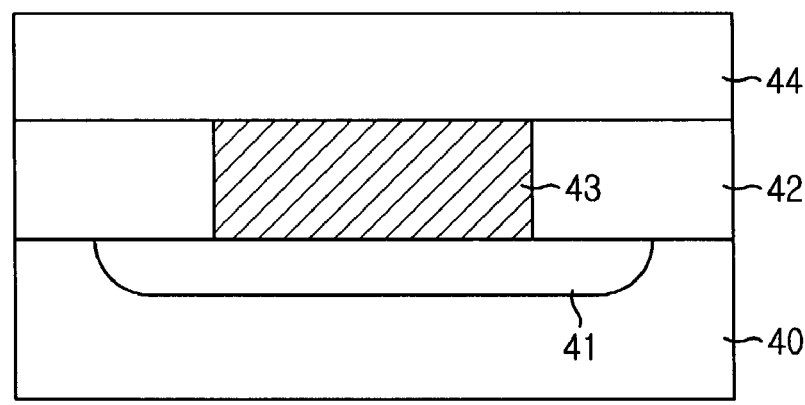
FIGS. 4A to 4F are cross-sectional views illustrating a process for forming contact by using an ArF lithography technology according to a third disclosed embodiment.

Referring to FIG. 4A, an interlayer insulating layer 42 is formed on a semiconductor substrate 40 in which an active layer 41, such as a source or drain, is formed. Thereafter, the interlayer insulating layer 42 is selectively etched to form a contact hole exposing the active layer 41, and then, a conducting layer is formed over the semiconductor substrate 40 and a process for flattening the conducting layer is performed until the surface of the interlayer insulating layer 42 is exposed, whereby a bit line contact plug 43, which is contacted to the active layer 41 through the contact hole, is obtained. Subsequently, an interlayer insulating layer 44 is formed on the interlayer insulting layer 42 and the bit line contact plug 43. In the preferred embodiment, the conducting layer is formed of a single crystalline silicon layer grown by the selective epitaxial growth or a poly crystalline silicon layer, and the interlayer insulating layer 44 is formed of an oxide of advanced planarization layer, a boro phospho silicate(BPSG), a spin on glass(SOG), a high density plasma oxide or a nitride layer.

Figure 4B:
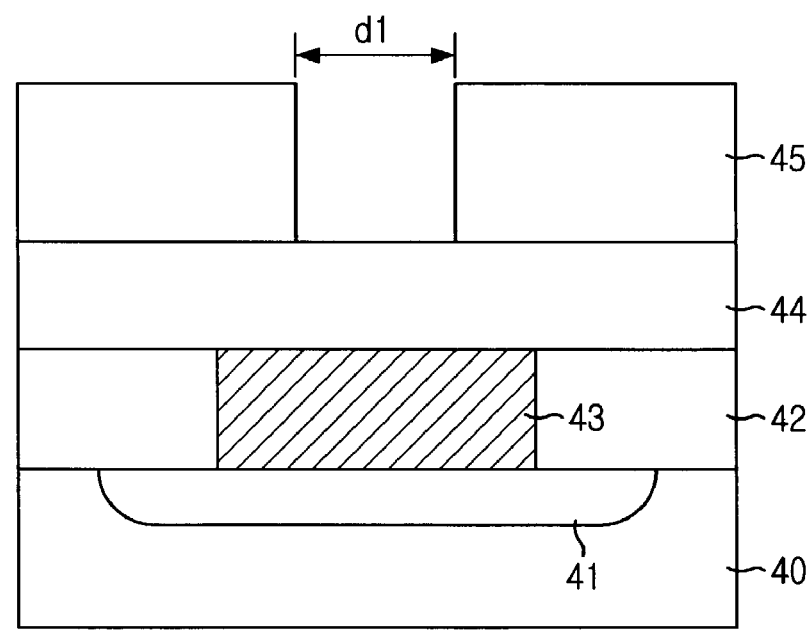

Referring to FIG. 4B, photoresist patterns 45 are formed by exposure with a light source of which wavelength is in the range of 157 nm to 193 nm, such as an ArF laser or $F_2$ laser on the interlayer insulating layer 44. The photoresist patterns 45 define contact holes of which critical dimension is d1 in order to expose a contact region. In a preferred embodiment, the photoresist patterns 45 are formed a resist of a COMA (cycloolefin-maleic anhydride) family or an acrylate family.

Figure 4C:
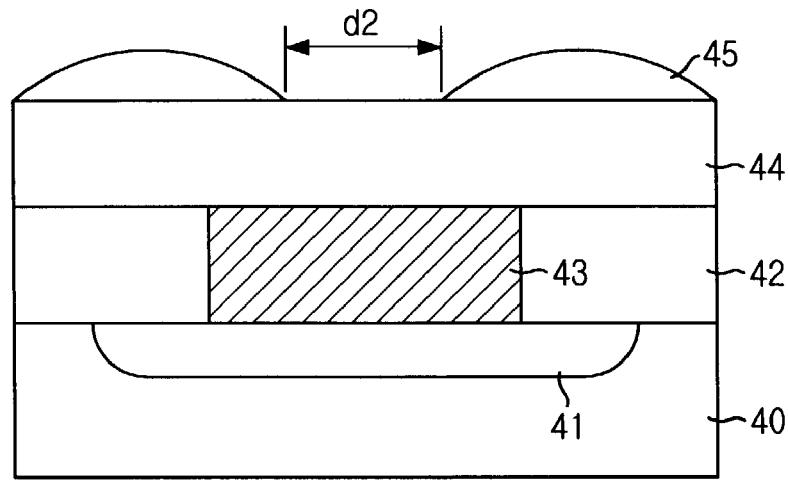

Referring to FIG. 4C, a flow process is performed to reduce the critical dimension of the contact hole from d1 to d2. The flow process is performed at a temperature ranging from about 100° C. to about 220° C. at normal pressure for 1 minute to 30 minutes using a hot plate, an oven or a UV bake.

Figure 4D:
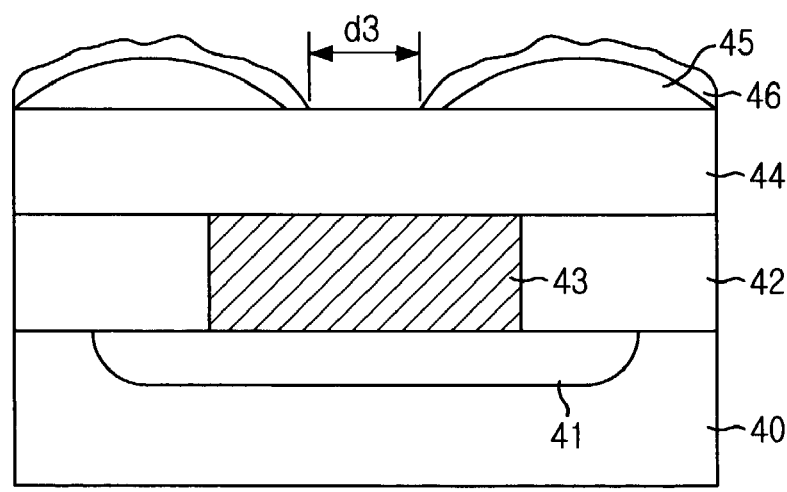

Referring to FIG. 4D, a polymer layer 46 is formed on the photoresist patterns 45 undergone the flow process to reduce the critical dimension of the contact hole from d2 to d3. The polymer layer is formed by supplying approximately 5 sccm to 20 sccm of a fluorine-based gas, approximately 100 sccm of an Ar gas, and approximately 1 to 5 sccm of an $O_2$ gas at pressure ranging from about 10 mTorr to about 50 mTorr with a power range from about 500 W to about 2000 W.

The fluorine-based gas is $C_xF_y$ or $C_aH_bF_c$, wherein x, y, a, b and c range from 1 to 10, respectively. It is possible to improve the reliability of the fabrication by protecting the photoresist patterns 45 undergone the flow process with the polymer layer 46 and to reduce the critical dimension of the contact hole by the thickness of the polymer layer 46.

Figure 4E:
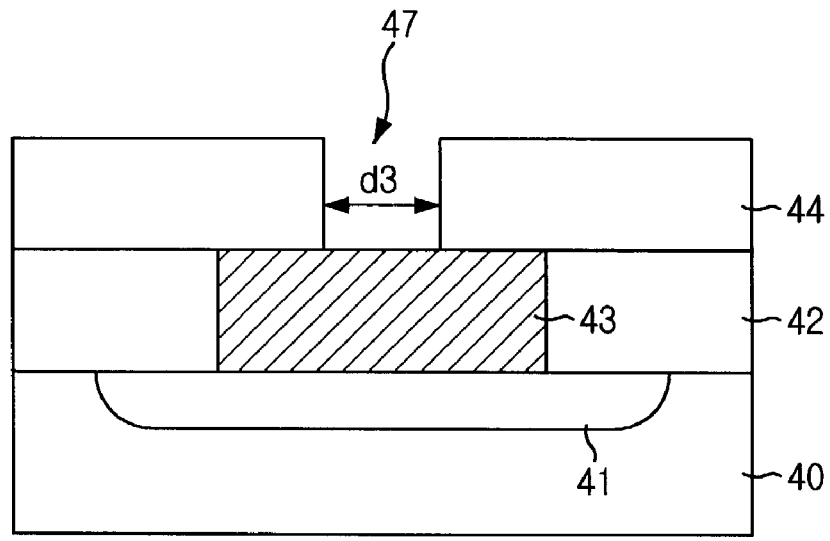

Referring to FIG. 4E, the interlayer insulating layer 44 is etched to form a contact hole 47, having the critical dimension d3 and exposing the bit line contact plug 42, by using the photoresist patterns 45 covered with the polymer layer 46 as an etch mask. Thereafter, the photoresist patterns 45 and the polymer layer 46 are removed.

Figure 4F:
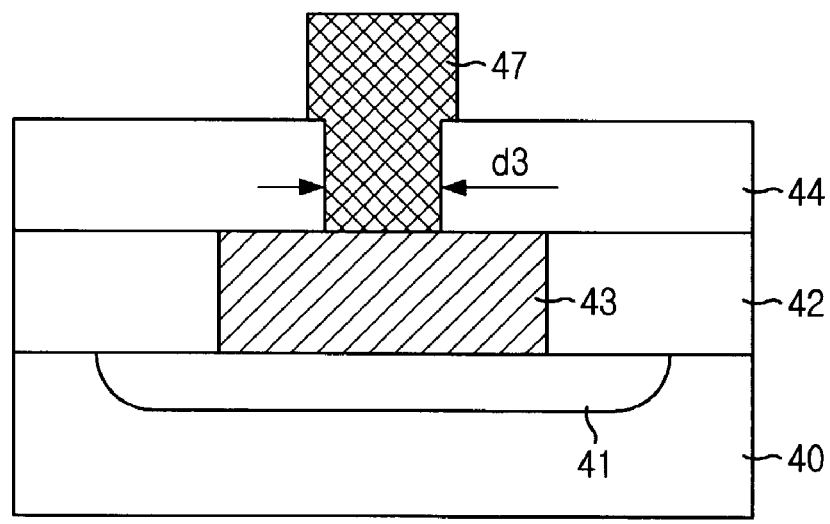

Referring to FIG. 4F, a bit line 48, contacted to the bit line contact plug 42 through the contact hole 47, is formed. In the preferred embodiment, the bit line 48 is formed of W, Ti or Co.

Figure 5:
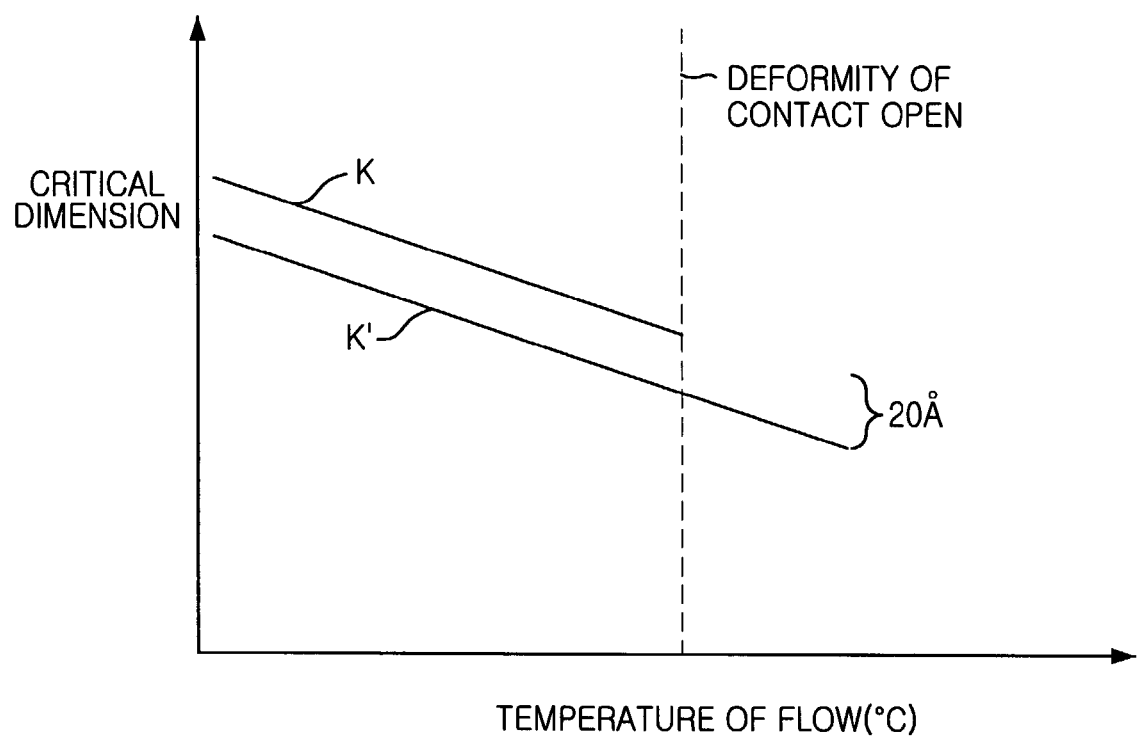
FIG. 5 is a graph showing variations of the critical dimension of the photoreist patterns according to variations of the temperature.

FIG. 5 shows the flow temperature dependency of the critical dimensions K and K'. In FIG. 5, the K denotes the critical dimension of the photoresist pattern formed with an exposure with a light source of which wavelength is in the range of 157 nm to 193 nm, such as an ArF laser or $F_2$ laser in accordance with the conventional method, and K' denotes the critical dimension of the photoresist pattern formed by the present invention. That is, the critical dimension K' is obtained from the photoresist pattern on which a polymer layer is formed after a flow process. As shown in FIG. 5, it is possible to reduce the critical dimension by 20 Å. By the third disclosed embodiment, it is possible to form fine patterns and to improve reliability by forming the polymer layer on the photoresist patterns, formed by the exposure with a light source of which wavelength is in the range of 157 nm to 193 nm, after flowing the photoresist patterns.

Accordingly, it is possible to prevent the photoresist patterns being deformed during the etch process with the photoresist patterns as an etch mask by forming the polymer layer on the photoresist patterns and by simultaneously etching a portion of the interlayer insulating layer with the plasma produced from fluorine and oxygen. Also, it is possible to prevent the photoresist patterns being deformed by using the photoresist patterns as an etch mask after forming the polymer layer on the photoresist patterns undergone the flow process to define fine region. In addition, it is possible to reduce the critical dimension by the thickness of the polymer layer, and thus a fine pattern can be obtained. Also, the etch tolerance of the photoresist patterns can be improved by hardening the photoresist patterns with injection of Ar or an electron beam.

While particular embodiments have been described, it will be apparent to those skilled in the art that various changes and modifications may be made without departing from the scope of this disclosure and the following claims.

What is claimed is:

1. A method comprising the sequential steps of:
   (a) coating a photoresist layer on an etch target layer;
   (b) exposing the photoresist layer to light having a wavelength of 157 nm to 193 nm and then developing the photoresist layer to form a photoresist pattern;
   (c) applying a flow of a mixture of fluorine-based gas, an Ar gas, and an $O_2$ gas to form a polymer layer on the photoresist pattern without deforming the photoresist pattern, wherein the photoresist pattern defines a critical dimension of less than 90 nm, the fluorine-based gas is $C_xF_y$ or $C_aH_bF_c$, and x, y, a, b, and c ranges from 1 to 10, the flow of $O_2$ gas is about 1 sccm to less than 5 sccm, the flow of fluorine-based gas is about 5 sccm to about 20 sccm, and the flow of Ar gas is about 100 sccm to about 1000 sccm; and,
   (d) etching the etch target layer using the polymer layer and the photoresist pattern as an etch mask.

2. The method as recited in claim 1, wherein the light is provided by an ArF laser or $F_2$ laser.

3. The method as recited in claim 2, wherein the photoresist layer is formed of COMA (cycloolefin-maleic anhydride) family or an acrylate family.

4. The method as recited in claim 1, wherein the polymer layer is formed at a temperature ranging from about 25° C. to about 80° C. at a pressure ranging from about 10 mTorr to about 50 mTorr with a power ranging from about 500 W to about 2000 W for approximately 10 seconds to 60 seconds.

5. The method as recited in claim 1, further comprising a step of hardening the photoresist pattern after the step of forming the photoresist pattern.

6. The method as recited in claim 5, wherein Ar ions are injected into the photoresist pattern at the step of hardening the photoresist pattern.

7. The method as recited in claim 6, wherein the Ar ions are implanted by a dose ranging from about $10^{10}/cm^3$ to about $10^{15}/cm^3$ with an energy ranging from 100 KeV to 300 KeV.

8. The method as recited in claim 5, wherein the photoresist pattern is treated with Ar plasma at the step of hardening the photoresist pattern.

9. The method as recited in claim 8, wherein the step of hardening the photoresist pattern is performed at a pressure ranging from about 1 mTorr to about 10 mTorr with a power ranging from about 500 W to about 2000 W.

10. The method as recited in claim 5, wherein an electron beam is injected into the photoresist pattern at the step of hardening the photoresist pattern.

11. The method as recited in claim 10, wherein an electron beam is injected with energy ranging from about 400 μC/cm³ to about 4000 μC/cm³.

12. The method as recited in claim 1, further comprising a step of hardening the photoresist pattern after forming the polymer layer.

13. The method as recited in claim 12, wherein Ar ions are injected into the photoresist pattern at the step of hardening the photoresist pattern.

14. The method as recited in claim 13, wherein the Ar ions are implanted by a dose ranging from about $10^{10}/cm^3$ to about $10^{15}/cm^3$ with an energy ranging from 100 KeV to 300 KeV.

15. The method as recited in claim 12, wherein the photoresist pattern is treated with Ar plasma at the step of hardening the photoresist pattern.

16. The method as recited in claim 15, wherein the step of hardening the photoresist pattern is performed at a pressure ranging from about 1 mTorr to about 10 mTorr with a power ranging from about 500 W to about 2000 W.

17. The method as recited in claim 12, wherein an electron beam is injected with energy ranging from about 400 μC/cm³ to about 4000 μC/cm³.

18. The method as recited in claim 1, further comprising a step of flowing the photoresist pattern after the step of forming the photoresist pattern.

19. The method as recited in claim 18, wherein the step of flowing the photoresist pattern is performed at a temperature ranging from about 100° C. to about 220° C. at normal pressure for 1 minute to 30 minutes using a hot plate, oven or a UV bake.

* * * * *